United States Patent [19]
Schweitzer, III

[11] Patent Number: 5,479,315
[45] Date of Patent: Dec. 26, 1995

[54] PROTECTIVE RELAY FOR POWER SYSTEMS CAPABLE OF BEING TESTED WITH LOW-LEVEL VOLTAGE AND CURRENT SIGNALS

[75] Inventor: Edmund O. Schweitzer, III, Pullman, Wash.

[73] Assignee: Schweitzer Engineering Laboratories, Inc., Pullman, Wash.

[21] Appl. No.: 422,763

[22] Filed: Apr. 14, 1995

Related U.S. Application Data

[63] Continuation of Ser. No. 45,550, Apr. 9, 1993, abandoned.
[51] Int. Cl.$^6$ ............................................. H02H 3/00
[52] U.S. Cl. ................... 361/62; 361/65; 361/79; 324/418; 324/527
[58] Field of Search ...................... 361/42, 47, 48, 361/60–65, 76, 79, 80; 324/415, 418, 424, 523, 527, 546, 555

[56] References Cited

U.S. PATENT DOCUMENTS

| | | | |
|---|---|---|---|
| 4,741,711 | 5/1988 | Singer, Jr. | 361/119 |
| 4,858,056 | 8/1989 | Russell | 361/42 |
| 5,270,658 | 12/1993 | Epstein | 324/424 |
| 5,378,479 | 1/1995 | Lombardi | 324/107 |

Primary Examiner—A. D. Pellinen
Assistant Examiner—Ronald W. Leja
Attorney, Agent, or Firm—Jensen & Puntigam

[57] ABSTRACT

The relay includes an input module capable of receiving 70 volt and 5 amp signals, respectively, from conventional instrument transformers, which are responsive to power line signals at their primaries. Output signals from the input module have specified, standardized levels suitable for electronic processing circuits, i.e. 1.4 volts and 0.1 volt. The output signals from the input module are applied through an accessible connector to a separate processing module which uses those signals in a conventional manner to determine possible faults on the power line. Low-level testing is accomplished by testing the outputs of the input module and by applying test signals simulating the standardized outputs of the input module to the processing module.

10 Claims, 1 Drawing Sheet

PROTECTIVE RELAY FOR POWER SYSTEMS CAPABLE OF BEING TESTED WITH LOW-LEVEL VOLTAGE AND CURRENT SIGNALS

TECHNICAL FIELD

This is a continuation of the application Ser. No. 08/045,550, filed on Apr. 9, 1993, now abandoned.

This invention relates generally to protective relays for electrical power transmission and distribution systems and more particularly concerns a relay configuration which permits low-level voltage and current testing of protective relays.

BACKGROUND OF THE INVENTION

In power system protection devices, potential transformers (PTs) and current transformers (CTs) have traditionally been used to reduce power line voltages and currents from their very high line levels to specific, relatively low levels, i.e. 70 volts and 5 amps. These signals are then applied to protective relays which determine power line fault conditions. As a consequence of a fault condition, current on the power line will increase such that the output from the CT increases to between 6 and 100 amps from the normal 5 amps. With conventional electromechanical relays, the output signals from PTs and CTs are applied to the relays directly; operating power for those relays is also provided by the PTs and CTs.

With the introduction of solid state, and then computer-type protective relays, the outputs of the conventional PTs and CTs (referred to herein as instrument Pts and CTs) were far too high to be compatible with the electronic circuitry of those relays, and, therefore, solid state/computer protective relays include input transformers, and voltage dividers and/ or shunts, which reduce the signal levels from the PTs and CTs down to, for instance, 1.4 volts and 100 MA, which are appropriate for electronic circuits.

To carry out necessary testing of electromechanical relays, test units were designed which are capable of reproducing the non-fault outputs of the conventional PTs and CTs, as well as reproducing the PT/CT outputs under certain line fault conditions. Ideally, this requires a test unit capable of producing 1000 VA (which is accomplished by injecting 100 amperes into an impedance of 0.1 ohms). As a practical matter, such test units will typically produce a test current of 25 amperes, producing 62.5 VA. This compromise, however, still requires large amplifiers and power supplies, which are heavy, bulky and expensive.

Such test units continue to be used even though many protective relays are now solid state/computer type relays which in operation do not require the conventional PT/CT signal levels, as indicated above. It would hence be desirable to have a test unit which produces a 1 VA output signal, which would be adequate for the relay circuits per se, in order to minimize weight and expense of the test unit. Also, it would be desirable to be able to test separately the operation of the input transformers and the operation of the actual relay itself under simulated fault conditions.

DISCLOSURE OF THE INVENTION

Accordingly, the invention is a relay for use in protecting power lines, wherein the relay is responsive to output signals from voltage and current instrument transformers, which reduce the voltage and current levels on the power lines to a specified fraction thereof, comprising: an input module which includes voltage and current input transformers responsive to signals from the voltage and current instrument transformers to produce input module output signals, at an output connection of the input module, wherein the output signals are at specified levels, with a predetermined accuracy, suitable for use in electronic processing circuits; a processing module for processing the input module output signals, which are received at an input connection of the processing module, to determine whether or not there is a fault on the power line; and a connector between the output connection of the input module and the input connection of the processing module, wherein the connector is sufficiently accessible to permit determination of the outputs from the input module and to provide test signals to the input connection of the processing module which simulate the signals of specified accuracy from the input module.

BEST MODE FOR CARRYING OUT THE INVENTION

Figure 1:
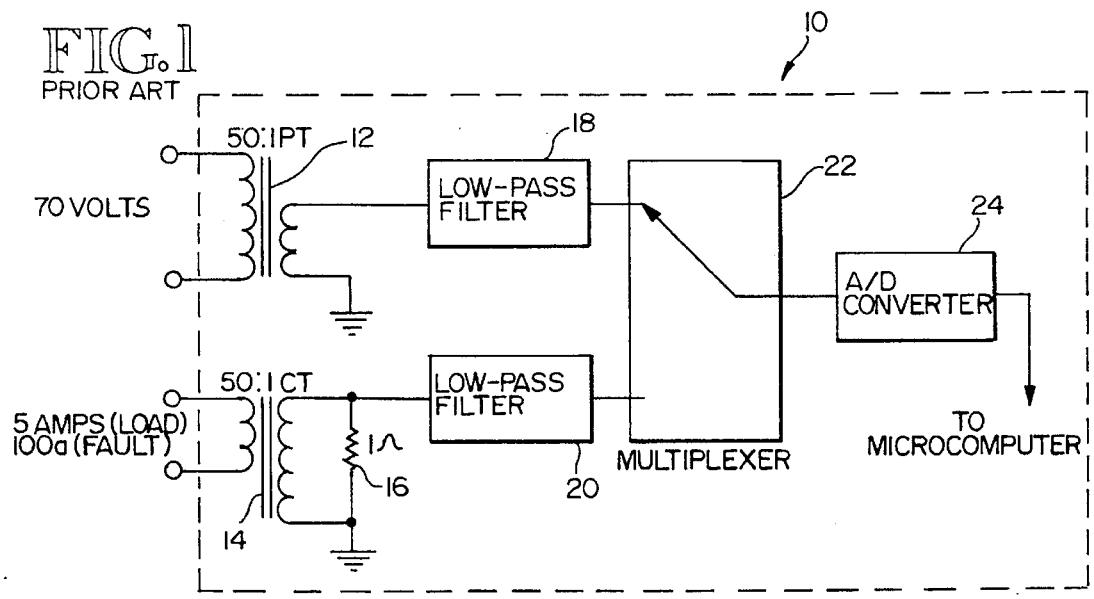
FIG. 1 is a block diagram of a prior art relay system.

FIG. 1 shows a portion 10 of a conventional digital relay as briefly described above. Instrument potential transformers (PTs) and instrument current transformers (CTs) (not shown) provide 70 volt and 5 amp signals, respectively, for each phase (A, B, C) of the power line signal. The circuitry for one phase is shown in FIG. 1 for illustration. Similar circuits are provided in a digital relay for the other phases. The 70 volt/5 amp signals from the external instrument PTs/CTs are applied to the primaries, respectively, of an input voltage transformer (PT) 12 and an input current transformer (CT) 14, both of which are within the relay 10 itself. In the embodiment shown, both are step-down transformers with a ratio of 50 to 1. This results in approximately 1.4 volts at the secondary of input PT 12 and 100 MA at the secondary of input CT 14, which operates into a 1 ohm resistance 16, providing a voltage output of 0.1 volt.

These signals are then applied to low pass filters 18 and 20 and from there to a multiplexer 22 along with similar signals from the other phases of the power signal. The output of multiplexer 22 is applied to an A to D converter 24 and then to the micro-computer which analyzes the signals from the A/D converter against reference signal levels to determine various fault conditions.

Figure 2:
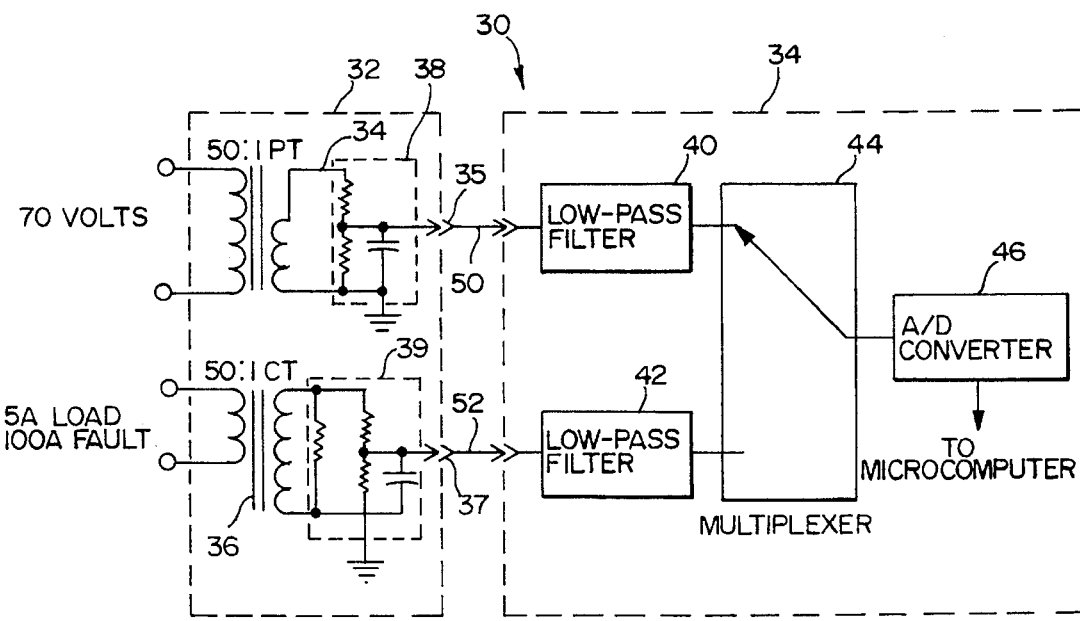
FIG. 2 is a block diagram of a relay system of the present invention.

FIG. 2 shows the relay configuration of the present invention which has a low-level test capability. In the embodiment of FIG. 2, the protective relay, shown generally at 30, comprises two sections or modules. The first module 32 includes (for one phase) an input PT 34 and an input CT 36, which are responsive, respectively, to the 70 volt and 5 amp outputs from the conventional instrument transformers. The signals from the secondaries of input PT 34 and input CT 36 are available at outputs 35, 37 of module 32. The secondaries of both the input PT 34 and input CT 36 have conventional magnitude and phase compensation circuits 38, 39 for test and calibration purposes, as shown by the dashed lines. Typically, the output signals from the input modules are standardized, calibrated outputs of 1.4 volts and 0.1 volt, respectively.

The outputs of module 32 are connected by connecting lines 50, 52 to the inputs 54, 56 of the second, i.e. processing, module 34. Module 34 in operation is responsive to the standardized, calibrated output signals of input module 32. Hence, in effect, module 34 has standardized input signals. Module 34 includes low-pass filters 40 and 42, a multiplexer 44, an A/D converter 46 and a micro-computer processor. It should be understood, however, while the input module described above includes input PTs and CTs which are responsive to 70 volts and 5 volt outputs from conventional instrument PTs and CTs, the input or in some cases even transformers could be adapted, eliminated, to make the input module 32 responsive to other, i.e., nonstandard, signal levels and still produce the desired standardized input signals to processing module 34. Hence, in every case, the signals at the output connections of the input module 32 are at the desired standard values suitable for use in the processing module electronic circuits.

In one typical example of an actual relay system, the input module comprises three precision voltage transformers, one for each phase of the power signal, each voltage transformer having a ratio of 50 to 1, which step the voltage in each phase down from 70 volts received from the instrument PTs to 1.4 volts. Three precision current transformers are also provided, each also having ratios of 50 to 1, which produce currents which in turn drive burden resistors of 1 ohm, producing 0.1 volt signals. This circuitry comprises voltage and current channels.

Additional circuitry will be present at the secondaries of each input PT and CT to compensate for phase shift and for amplitude adjustment. This ensures that the voltage and current outputs from the input module are precise replicas of the voltage and current signals from the instrument transformers and are at the desired standard levels. Likewise, the processing module will have three voltage and three current channels, one voltage and one current channel for each phase of the power signal.

The above described configuration makes the input module 32, with its standardized, calibrated output signals, essentially structurally independent of the processing module 34, permitting, for instance, similarly rated input modules to be used or exchanged with a particular processing module, and vice versa, as the need arises. Either the input module and/or the processing module could be built in permanently in a relay case or could be designed to be easily withdrawn.

As indicated above, the input and processing modules are connected by connecting lines. It is important that the connecting lines be readily accessible for testing of the modules. The output of the input module 32 can be tested to verify the desired identity in shape and amplitude relative to the input signal and to verify the standardized outputs, while the processing module 34 can be separately and independently tested, using low-level input signals. This arrangement permits any errors produced by the input transformers in the input module to be readily identified and distinguished from errors in the processing module, i.e. the relay itself. The input module and the processing module could both be equipped with ribbon cable connectors. The connection lines between the two modules then is a short length of ribbon cable having end connectors which mate with the ribbon connectors at the output of the input module and the input of the processing module. Such a connection can be easily accessed by a test engineer or a technician, particularly if the module connections are located just inside a conveniently removable panel of the relay, so that upon removal thereof, the connection is readily accessible.

An appropriate test procedure includes first disabling the output of the relay to prevent output signals produced as a result of the testing which would result in unwarranted tripping of circuit breakers for the power system from reaching those circuits, and also disabling the control circuits for the relay. Access to the connections between the two modules is achieved, for instance, by removing the front panel. The connection itself, i.e. the ribbon cable, is then removed or separated from either or both of the two modules. The input module is tested by first measuring the input voltages and currents, which typically are provided by the conventional instrument transformers, and then measuring the output voltages. These measurements are made with conventional multi-function meters having the required accuracy. Proper operation of the input module is thus determined in a simple, straight forward manner, with relatively inexpensive, commercially available instrumentation.

The processing module is then tested by providing the appropriate standardized signals (1.4 volts, 0.1 volts) at the input thereof by an appropriate test unit. Because the test unit need only simulate the voltages which would be produced by the input transformers and/or shunts, instead of simulating the voltage and current outputs from the conventional instrument transformers, which are approximately 50 times higher, a relatively simple, inexpensive and lightweight test unit can be used. When the standard signals are applied to the input of the processing module, the operation of and the outputs of, the processing module are observed to determine proper operation.

With the relay arrangement of the present invention, the input module can be separately and conveniently tested with a commercially available meter, and the processing module can be tested using a much simpler test instrument than what was heretofore possible. In addition, the testing of the processing module can be more thorough than heretofore practical, i.e. the entire affected range (including fault currents of up to 100 amps) can be covered since a test unit can readily simulate input signals to the processing module which correspond to 100 amps applied to the input module.

If, at the conclusion of the test, either the input module or the processing module are determined to be faulty, either of those modules may be individually removed and replaced, while the other module remains. The faulty unit may be repaired, or possibly recalibrated. Since only one module (either input or processing) will typically be replaced, repair costs will decrease.

Hence, a protective relay system has been disclosed which has a two module configuration. An input module and a processing module are connected by a removable interconnection which is accessible to the test technician. This arrangement permits convenient, low level testing of the complete relay with relatively lightweight, inexpensive test equipment.

Although this invention has been described for use with a power line system, it could also be used to protect other power systems and apparatus, such as motors, etc. Also, the voltage and current signals provided to the input module may not necessarily be provided by instrument transformers.

Although a preferred embodiment of the invention has been disclosed herein for illustration it should be understood that various changes, modifications and substitutions may be incorporated in such embodiment without departing from the spirit of the invention, which is defined by the claims which follow:

What is claimed is:

1. A relay, capable of being operationally tested by low-level signals suitable for electronic processing circuits, for use in protecting power transmission and distribution lines, the relay being responsive to output signals from voltage and current instrument transformers which reduce the voltage and current levels on the power lines to a specified small fraction thereof, comprising:

an input module comprising a first group of circuit elements which includes voltage and current input transformers responsive to signals from the voltage and current instrument transformers to produce input module output signals, at an output connection of the input module, wherein the output signals are at specified levels, with a predetermined accuracy, suitable for use in electronic processing circuits;

a processing module comprising a second group of circuit elements for processing the input module output signals, which are received at an input connection of the processing module, to determine whether or not there is a fault on the power line and if there is a fault, to produce a trip signal for actuation of an associated circuit breaker; and a connector between the output connection of the input module and the input connection of the processing module, wherein the output connection of the input module and the input connection of the processing module are sufficiently accessible to permit convenient determination of the outputs from the input module and to permit test signals to be provided to the input connection of the processing module which simulate the signals of specified accuracy from the input module.

2. An apparatus of claim 1, including means in the input module for calibrating the output signals therefrom, so that the output signals are proportional to the output signals from the instrument transformers and at the specified levels.

3. An apparatus of claim 1, wherein the signal from the instrument voltage transformer is approximately 70 volts and the signal from the instrument current transformer is approximately 5 amps and wherein the output of the voltage transformer in the input module is 1.4 volts and the output of the current transformer, which includes a resistance shunt, is 0.1 volt.

4. An apparatus of claim 1, wherein the input module includes a voltage transformer and a current transformer for each phase of the power signal.

5. An apparatus of claim 1, wherein the input module and the processing module are mounted within a single housing.

6. A relay, capable of being operationally tested by low-level signals suitable for electronic processing circuits, for use in protecting power apparatus, the relay being responsive to signals from voltage and current instrument transformers which reduce the voltage and current levels at the power apparatus to a specified fraction thereof, comprising:

an input module comprising a first group of circuit elements which includes voltage and current input transformers responsive to the signals from the voltage and current instrument transformers to produce input module output signals, at an output connection of the input module, wherein the output signals are at specified levels, with a predetermined accuracy, suitable for use in electronic processing circuits;

a processing module comprising a second group of circuit elements for processing the input module output signals, which are received at an input connection of the processing module, to determine proper operation of the power apparatus and to produce a trip signal for actuation of an associated circuit breaker if the power apparatus is not operating properly; and a connector between the output connection of the input module and the input connection of the processing module, wherein the output connection of the input module and the input connection of the processing module are sufficiently accessible to permit convenient determination of the outputs from the input module and to permit test signals to be provided to the input connection of the processing module which simulate the signals of specified accuracy from the input module.

7. An apparatus of claim 6, including means in the input module for calibrating the output signals therefrom, so that the output signals are proportional to the output signals from the instrument transformers and at the specified levels.

8. An apparatus of claim 6, wherein the input module and the processing module are mounted within a single housing.

9. A relay, capable of being operationally tested by low-level signals suitable for electronic processing circuits, for use in protecting power systems, the relay being responsive to voltage and current signals which have been reduced from their levels at the power system to a specified small fraction thereof, comprising:

an input module comprising a first group of circuit elements which includes means responsive to the reduced voltage and current signals to produce input module output signals, at an output connection of the input module, wherein the output signals are at specified levels, with a predetermined accuracy, suitable for use in electronic processing circuits;

a processing module comprising a second group of circuit elements for processing the input module output signals, which are received at an input connection of the processing module, to determine proper operating condition of the power system and to produce a trip signal for actuation of an associated circuit breaker if the power system is not operating properly; and a connector between the output connection of the input module and the input connection of the processing module, wherein the output connection of the input module and the input connection of the processing module are sufficiently accessible to permit convenient determination of the outputs from the input module and to permit test signals to be provided to the input connection of the processing module which simulate the signals of specified accuracy from the input module.

10. An apparatus of claim 9, including means in the input module for calibrating the output signals therefrom, so that the output signals are proportional to the reduced signals.

\* \* \* \* \*